US009837567B2

(12) United States Patent
Hatano et al.

(10) Patent No.: US 9,837,567 B2
(45) Date of Patent: Dec. 5, 2017

(54) STAINLESS STEEL SUBSTRATE FOR SOLAR CELL HAVING SUPERIOR INSULATING PROPERTIES AND LOW THERMAL EXPANSION COEFFICIENT AND METHOD OF PRODUCING THE SAME

(71) Applicant: NIPPON STEEL & SUMIKIN STAINLESS STEEL CORPORATION, Tokyo (JP)

(72) Inventors: Masaharu Hatano, Hikari (JP); Eiichiro Ishimaru, Hikari (JP); Kenji Hattori, Tokyo (JP)

(73) Assignee: NIPPON STEEL & SUMIKIN STAINLESS STEEL CORPORATION, Tokyo (JP)

( * ) Notice: Subject to any disclaimer, the term of this patent is extended or adjusted under 35 U.S.C. 154(b) by 182 days.

(21) Appl. No.: 14/888,860

(22) PCT Filed: May 2, 2014

(86) PCT No.: PCT/JP2014/062152
§ 371 (c)(1),
(2) Date: Nov. 3, 2015

(87) PCT Pub. No.: WO2014/181768
PCT Pub. Date: Nov. 13, 2014

(65) Prior Publication Data
US 2016/0079455 A1   Mar. 17, 2016

(30) Foreign Application Priority Data

May 10, 2013 (JP) ................. 2013-100592

(51) Int. Cl.
| *C23C 8/10* | (2006.01) |
| *H01L 31/00* | (2006.01) |
| *H01L 31/0392* | (2006.01) |
| *C21D 1/76* | (2006.01) |
| *C21D 9/46* | (2006.01) |
| *C23C 8/18* | (2006.01) |
| *C22C 38/00* | (2006.01) |
| *C22C 38/38* | (2006.01) |
| *C22C 38/58* | (2006.01) |
| *C21D 6/00* | (2006.01) |

(Continued)

(52) U.S. Cl.
CPC ............ *H01L 31/0392* (2013.01); *C21D 1/76* (2013.01); *C21D 6/002* (2013.01); *C21D 8/0478* (2013.01); *C21D 8/0484* (2013.01); *C21D 9/46* (2013.01); *C22C 38/00* (2013.01); *C22C 38/001* (2013.01); *C22C 38/002* (2013.01); *C22C 38/004* (2013.01); *C22C 38/005* (2013.01); *C22C 38/008* (2013.01); *C22C 38/02* (2013.01); *C22C 38/04* (2013.01); *C22C 38/06* (2013.01); *C22C 38/22* (2013.01); *C22C 38/24* (2013.01); *C22C 38/26* (2013.01); *C22C 38/28* (2013.01); *C22C 38/30* (2013.01); *C22C 38/32* (2013.01); *C22C 38/38* (2013.01); *C22C 38/42* (2013.01); *C22C 38/48* (2013.01); *C22C 38/50* (2013.01); *C22C 38/58* (2013.01); *C23C 8/14* (2013.01); *C23C 8/18* (2013.01); *H01L 31/03923* (2013.01); *Y02E 10/541* (2013.01); *Y02P 70/521* (2015.11)

(58) Field of Classification Search
CPC . H01L 31/03923; H01L 31/0392; C21D 9/46; C21D 6/002; C21D 8/0478; C21D 8/0484; C21D 1/76; C22C 38/00; C22C 38/38; C22C 38/58; C22C 38/50; C22C 38/48; C22C 38/42; C22C 38/32; C22C 38/30; C22C 38/28; C22C 38/26; C22C 38/24; C22C 38/22; C22C 38/06; C22C 38/04; C22C 38/02; C22C 38/008; C22C 38/005; C22C 38/004; C22C 38/002; C22C 38/001; C23C 8/18; C23C 8/14; Y02E 10/541; Y02P 70/521
USPC .......................................... 136/252; 148/285
See application file for complete search history.

(56) References Cited

U.S. PATENT DOCUMENTS

| 5,565,272 A | 10/1996 | Masui et al. |
| 2011/0186131 A1 | 8/2011 | Mukai et al. |
| 2014/0011044 A1 | 1/2014 | Yamaguchi et al. |

FOREIGN PATENT DOCUMENTS

| EP | 0 810 295 A1 * | 12/1997 |
| EP | 0 810 295 A1 | 12/1997 |

(Continued)

OTHER PUBLICATIONS

International Search Report, issued in PCT/JP2014/062152, dated Aug. 12, 2014.
Office Action, issued in TW 103116251, dated Apr. 24, 2015.
Written Opinion of the International Searching Authority, issued in PCT/JP2014/062152, dated Aug. 12, 2014.
Extended European Search Report, dated Dec. 16, 2016, for counterpart European Application No. 14794499.5.
Office Head et al., "Stainless Steel Plates & Sheets," Jan. 1, 2010, XP055327418, https://nssc.nssmc.com/en/pdf/product/stainless_plate_e_09-01.pdf, pp. 1-21 (24 pages).

(Continued)

*Primary Examiner* — William Cheung
(74) *Attorney, Agent, or Firm* — Birch, Stewart, Kolasch & Birch, LLP

(57) ABSTRACT

Provided is a stainless steel substrate for a solar cell, the stainless steel substrate including, by mass %, Cr: 9% to 25%, C: 0.03% or less, Mn: 2% or less, P: 0.05% or less, S: 0.01% or less, N: 0.03% or less, Al: 0.005% to 5.0%, Si: 0.05% to 4.0%, and a remainder including Fe and unavoidable impurities, in which an oxide film containing (i) $Al_2O_3$ in an amount of 50% or more or containing (i) $Al_2O_3$ and (ii) $SiO_2$ in a total amount of 50% or more is formed on a surface of stainless steel having a composition which contains Al: 0.5% or more and/or Si: 0.4% or more and satisfies the following expression (1).

Cr+10Si+Mn+Al>24.5    (1)

11 Claims, No Drawings

(51) Int. Cl.
*C21D 8/04* (2006.01)
*C22C 38/02* (2006.01)
*C22C 38/04* (2006.01)
*C22C 38/06* (2006.01)
*C22C 38/22* (2006.01)
*C22C 38/24* (2006.01)
*C22C 38/26* (2006.01)
*C22C 38/28* (2006.01)
*C22C 38/30* (2006.01)
*C22C 38/32* (2006.01)
*C22C 38/42* (2006.01)
*C22C 38/48* (2006.01)
*C22C 38/50* (2006.01)
*C23C 8/14* (2006.01)

(56) References Cited

FOREIGN PATENT DOCUMENTS

| JP | 63-155681 A | 6/1988 |
| JP | 6-17261 A | 1/1994 |
| JP | 6-299347 A | 10/1994 |
| JP | 6-306611 A | 11/1994 |
| JP | 7-316746 A | 12/1995 |
| JP | 2002-60924 A | 2/2002 |
| JP | 2005-254688 A | 9/2005 |
| JP | 2011-32524 A | 2/2011 |
| JP | 2011-162863 A | 8/2011 |
| JP | 2011-204723 A | 10/2011 |
| JP | 2012-59854 A | 3/2012 |
| JP | 2012-59855 A | 3/2012 |
| JP | 2012-97341 A | 3/2012 |
| JP | 2012-169479 A | 9/2012 |
| JP | 2012-182287 A | 9/2012 |
| JP | 2012-214886 A | 11/2012 |
| KR | 10-2010-0106922 A | 10/2010 |
| TW | 201240107 A1 | 10/2012 |

OTHER PUBLICATIONS

Japanese Notice of Reasons for Rejection for counterpart Japanese Application No. 2013-100592, dated Mar. 7, 2017, with an English translation.

Chinese Office Action and Search Report dated Aug. 1, 2016, for Chinese Application No. 201480025682.X with the English translation of the Search Report.

Korean Office Action dated Jul. 9, 2016, for Korean Application No. 10-2015-7032186 with the partial English translation.

\* cited by examiner

STAINLESS STEEL SUBSTRATE FOR SOLAR CELL HAVING SUPERIOR INSULATING PROPERTIES AND LOW THERMAL EXPANSION COEFFICIENT AND METHOD OF PRODUCING THE SAME

This application is a national stage of PCT International Application No. PCT/JP2014/062152 filed in Japan on May 2, 2014, which claims priority to and incorporates by reference the entire contents of Japanese Patent Application No. 2013-100592 filed in Japan on May 10, 2013.

TECHNICAL FIELD

The present invention relates to a stainless steel substrate for a solar cell having a low thermal expansion coefficient with a surface on which an insulating oxide film is formed without using a coating method, and a method of producing the same.

Priority is claimed on Japanese Patent Application No. 2013-100592, filed May 10, 2013, the content of which is incorporated herein by reference.

BACKGROUND ART

Hitherto, the application of not only ceramics or glasses having a low thermal expansion coefficient but also cheap stainless steel having superior heat resistance to an insulating substrate is considered.

For example, PTL 1 and 2 disclose insulating materials in which a smooth surface of a stainless steel sheet is coated with an alumina, silicon oxide, or silicon nitride film. As these materials, commonly-used ferritic stainless steel SUS430 (17Cr steel) is used.

Further, PTL 3 discloses a material with a stainless steel surface having superior film formability in which both surface roughness parameters Rz and Rsk are specified. As this material, SUS430J1L (18Cr-0.4Cu-0.4Nb) to which Nb and Cu have been added and commonly-used austenitic stainless steel SUS304 (18Cr-8Ni), are used.

Recently, photovoltaic power generation has been developed as a major energy alternative to fossil fuels, and the development of techniques for a solar cell has been accelerated. Among these techniques, it is expected that a CIS (chalcopyrite) solar cell will be widely used in the future as a solar cell in which low cost and high efficiency are simultaneously realized. In the CIS solar cell, an electrode layer formed of Mo is formed on a substrate, and a chalcopyrite compound layer as a light-absorbing layer is formed on the electrode layer. The chalcopyrite compound is a quinary alloy represented by $Cu(InGa)(SeS)_2$.

In the related art, glass which is an insulator having a low thermal expansion coefficient has been widely used for a substrate for a solar cell. However, since glass is brittle and heavy, it is difficult to mass-produce a substrate for a solar cell in which a light-absorbing layer is formed on a glass surface. Therefore, recently, the development of a substrate for a solar cell using stainless steel which has superior heat resistance and a good balance between strength and ductility, has progressed in order to realize weight reduction and mass production.

For example, PTL 4 discloses a method of producing a substrate for a solar cell, the method including: forming an insulating film formed of alumina on stainless steel foil having a thickness of 0.2 mm or less; forming an electrode formed of Mo on the insulating film; and forming a $Cu(In_{1-x}Ga_x)Se_2$ film as a light-absorbing layer on the electrode. As the stainless steel foil, SUS430, SUS444 (18Cr-2Mo), or SUS447J1 (30Cr-2Mo) is used.

In addition, PTL 5 and 6 discloses electrode substrates for a CIS solar cell in which a Mo film is formed on a Cu coating layer of a Cu-coated steel sheet, and a $Cu(InGa)(SeS)_2$ compound layer is formed on the Mo film. PTL 5 and 6 discloses that ferritic stainless steel is used as a base material of the Cu-coated steel sheet, the ferritic stainless steel containing C: 0.0001% to 0.15%, Si: 0.001% to 1.2%, Mn: 0.001% to 1.2%, P: 0.001% to 0.04%, S: 0.0005% to 0.03%, Ni: 0% to 0.6%, Cr: 11.5% to 32.0%, Mo: 0% to 2.5%, Cu: 0% to 1.0%, Nb: 0% to 1.0%, Ti: 0% to 1.0%, Al: 0% to 0.2%, N: 0% to 0.025%, B: 0% to 0.01%, V: 0% to 0.5%, W: 0% to 0.3%, a total amount of Ca, Mg, Y, REM (rare earth elements): 0% to 0.1%, and a remainder including Fe and unavoidable impurities. However, the ferritic stainless steel used in Examples is limited to SUS430.

PTL 7 discloses stainless steel on which an insulating film having superior heat resistance is formed, and a method of producing the same. PTL 7 discloses that the stainless steel as a substrate contains C: 0.0001% to 0.15%, Si: 0.001% to 1.2%, Mn: 0.001% to 2.0%, P: 0.001% to 0.05%, S: 0.0005% to 0.03%, Ni: 0% to 2.0%, Cu: 0% to 1.0%, Cr: 11.0% to 32.0%, Mo: 0% to 3.0%, Al: 1.0% to 6.0%, Nb: 0% to 1.0%, Ti: 0% to 1.0%, N: 0% to 0.025%, B: 0% to 0.01%, V: 0% to 0.5%, W: 0% to 0.3%, a total amount of Ca, Mg, Y, REM (rare earth elements): 0% to 0.1%, and a remainder including Fe and unavoidable impurities, in which a mixed layer of NiO and $NiFe_2O_4$ having a thickness of 1.0 μm or more is formed on a surface of the substrate with an Al oxide layer interposed therebetween. Steel used in Examples is Al-containing ferritic stainless steel containing Si: less than 0.4%. In addition, PTL 7 describes that the Si content in the steel may be controlled to be 0.5% or less. In addition, the mixed layer of NiO and $NiFe_2O_4$ and the Al oxide layer are formed by forming a Ni plating layer through electroplating, and then forming an Al oxide layer at an interface between the steel and the Ni plating layer and modifying the Ni plating layer into an oxide layer through a heat treatment in air.

On the other hand, PTL 8 and 9 disclose methods of producing stainless steel in which insulating properties are imparted to a stainless steel surface without using a method of coating a coating material. PTL 8 discloses a method of heating a ferritic stainless steel sheet containing 2% or more of Al to 850° C. or higher to form an aluminum oxide layer thereon. However, in Examples, the time of a heat treatment on steel obtained by adding Al to SUS430 containing impurities such as C or N is limited to 60 minutes. In addition, PTL 9 discloses stainless steel whose entire surface is coated with $\alpha\text{-}Al_2O_3$ containing equiaxed crystals or columnar crystals by performing an oxidation treatment thereon at 1000° C. for one hour or longer. However, the stainless steel used in Examples is limited to 20Cr-5Al.

CITATION LIST

Patent Literature

[PTL 1] Japanese Unexamined Patent Application, First Publication No. H6-299347

[PTL 2] Japanese Unexamined Patent Application, First Publication No. H6-306611

[PTL 3] Japanese Unexamined Patent Application, First Publication No. 2011-204723

[PTL 4] Japanese Unexamined Patent Application, First Publication No. 2012-169479

[PTL 5] Japanese Unexamined Patent Application, First Publication No. 2012-59854
[PTL 6] Japanese Unexamined Patent Application, First Publication No. 2012-59855
[PTL 7] Japanese Unexamined Patent Application, First Publication No. 2012-214886
[PTL 8] Japanese Unexamined Patent Application, First Publication No. S63-155681
[PTL 9] Japanese Unexamined Patent Application, First Publication No. 2002-60924

SUMMARY OF INVENTION

Technical Problem

As described above, in order to realize weight reduction and mass production and to make a solar cell widely used, the application of stainless steel to a substrate is effective. In order to make a CIS solar cell widely used as a major photovoltaic power generation source in the future, cost reduction obtained by removing a troublesome surface treatment such as coating is an important goal.

The achievement of the above-described goal relates to insulating properties of stainless steel used for a substrate.

That is, in regard to the above-described goal, it is preferable to obtain an insulating surface capable of preventing deterioration in the conversion efficiency of a solar cell without using a coating or plating method. In regard to this point, as disclosed in PTL 1 to 7, hitherto, application techniques of stainless steel using a coating or plating method have been mainly used. Further, current techniques of imparting insulating properties without using a coating method are limited to the method of performing a heat treatment on the stainless steel, which is obtained by adding Al to SUS430, at 850° C. or higher for 60 minutes as disclosed in PTL 8; or a method of performing a heat treatment on 20Cr-5Al stainless steel at 1000° C. or higher for one hour or longer as disclosed in PTL 9.

An object of the present invention is to provide: a stainless steel substrate for a solar cell with a surface on which an oxide film having superior insulating properties is formed such that the conversion efficiency of a solar cell can be maintained at a high level; and a method of producing a substrate for a solar cell capable of forming an oxide film having superior insulating properties on a substrate surface without using a coating method.

Solution to Problem

In order to achieve the above-described goal, the present inventors repeatedly performed experiments and investigations focusing on the effects of alloy elements (for example, Cr, Si, or Al) on insulating properties of an oxide film that is formed on a surface of ferritic stainless steel through a heat treatment, thereby completing the present invention. Hereinafter, the findings obtained regarding the present invention will be described.

(a) Al is an element which is effective to impart insulating properties to a stainless steel by forming an alumina ($Al_2O_3$) film on the surface thereof through a heat treatment. In order to form an insulating surface using the alumina film, using ferritic stainless steel containing 3% to 6% of Al represented by SUH21 (18Cr-3Al) or 20Cr-5Al as a material, may be considered. However, the thermal expansion coefficient of the ferritic stainless steel containing a large amount of Al may not be low when the temperature increases during the formation of an electrode layer and a light-absorbing layer of a CIS solar cell, which causes a problem in film formability and cell durability. In particular, in stainless steel in which the Al content is 2.0% or more, the thermal expansion coefficient is significantly high. Furthermore, in the addition of Al to SUS430 containing a large amount of impurities, there are not only the problems of material properties including the thermal expansion coefficient but also the limitation of heat treatment conditions (850° C., one hour or longer) for forming the alumina film.

The present inventors found that, in stainless steel obtained by adding Si and adjusting the Cr content without adding an excess amount of Al, the following significant effects can be obtained: the thermal expansion coefficient is low; and an oxide film having surface insulating properties suitable for improving the durability of a solar cell can be formed through a heat treatment. There are many unclear points in the effect of improving insulating properties obtained by the oxide film which is formed on the surface of the Si-added and Al-containing ferritic stainless steel having a low thermal expansion coefficient through a heat treatment. However, the mechanism of action thereof can be surmised based on investigation results described below.

(b) In addition to Cr, Si is an element which is effective to decrease the thermal expansion coefficient of the ferritic stainless steel. In particular, an increase in thermal expansion coefficient caused by Al addition can be effectively suppressed by adding 0.3% or more of Si to the stainless steel containing 2.0% or more of Al. In addition, Si acts effectively not only to decrease the thermal expansion coefficient but also to form the insulating oxide film. By performing a heat treatment on the stainless steel with added Si, a $SiO_2$ continuous film is formed on a surface thereof. This $SiO_2$ continuous film may not impart insulating properties but has effects of significantly increasing the electrical resistance of $Cr_2O_3$ as a semiconductor, and promoting the formation of an insulating $Al_2O_3$ film. It was found that the effect of modifying the oxide film obtained by Si is exhibited by adding 0.4% or more of Si.

(c) The surface of the oxide film, which is formed on the surface of the Al-containing ferritic stainless steel with added Si by performing a heat treatment thereon, was analyzed in more detail. Based on the surface analysis, it was newly found that superior insulating properties can be imparted to a substrate for a solar cell by an oxide film containing (i) $Al_2O_3$ in an amount of 50% or more or containing (i) $Al_2O_3$ and (ii) $SiO_2$ in a total amount of 50% or more. In addition, it was newly found that, when the oxide film further contains (iii) Al-containing spinel oxide ($MgAl_2O_4$) in addition to (i) $Al_2O_3$ or (i) $Al_2O_3$ and (ii) $SiO_2$, far superior insulating properties can be obtained. In the related art, plating or a long-term heat treatment is performed in order to optimize characteristics of (i) $Al_2O_3$ such as thickness or soundness ($\gamma$, $\theta \rightarrow \alpha$). On the other hand, when the oxide film contains (iii) $MgAl_2O_4$ inside the film, a significant effect of improving the insulating properties of the surface irrespective of the characteristics of (i) $Al_2O_3$ is exhibited.

(d) The following was found: in order to obtain the effect of promoting the formation of an oxide film containing (i) $Al_2O_3$ or an oxide film containing (i) $Al_2O_3$ and (ii) $SiO_2$ and/or (iii) $MgAl_2O_4$, it is effective to limit the amount of each element of Cr, Si, Mn, and Al and to adjust an alloy composition so as to satisfy Cr+10Si+Mn+Al>24.5 (wherein a symbol of each element represents the amount (mass %) of the element in the steel). Mn suppresses the oxidation of Fe during the heat treatment of the stainless steel and promotes the formation of the insulating oxide film which contains an Al-containing oxide and a Si-containing oxide.

In addition to the major constituent elements of Cr, Si, Mn, and Al, a small amount of Mg has an effect of promoting the formation of an Al spinel oxide to improve insulating properties. Further, when Sn and Zr are added in combination, the formation of (i) to (iii) is promoted. In addition, it was found that the adjustment of the alloy composition is effective not only to form the oxide film but also to suppress an increase in the thermal expansion coefficient of the Al-containing ferritic stainless steel.

(e) In order to enhance the effect of improving surface insulating properties obtained by the oxide film, it is effective to purify the steel by reducing the amounts of C, N, P, and S and to further add Nb or Ti as a stabilizing element.

(f) In order to form the oxide film described in (c), it is preferable to further perform a heat treatment on the stainless steel having the above-described alloy composition, which is obtained through well-known processes of annealing, pickling, and polishing, in an atmosphere containing water vapor and oxygen at 300° C. to 1000° C. In particular, in order to promote the formation of not only (i) $Al_2O_3$ but also (iii) $MgAl_2O_4$, it is effective to perform the heat treatment after increasing a dew point of the atmosphere to be 40° C. or higher.

The summary of the present invention which has been made based on the above-described findings (a) to (f) is as follows.

(1) A stainless steel substrate for a solar cell having superior insulating properties and a low thermal expansion coefficient, the stainless steel substrate including: stainless steel which contains, by mass %, Cr: 9% to 25%,
C: 0.03% or less,
Mn: 2% or less,
P: 0.05% or less,
S: 0.01% or less,
N: 0.03% or less,
Al: 0.005% to 5.0%,
Si: 0.05% to 4.0%, and
a remainder including Fe and unavoidable impurities, satisfies one or both of Al content is 0.5% or more and Si content is 0.4% or more, and satisfies the following expression (1); and an oxide film formed on a surface of the stainless steel, the oxide film containing (i) $Al_2O_3$ in an amount of 50% or more or containing (i) $Al_2O_3$ and (ii) $SiO_2$ in a total amount of 50% or more, $$Cr+10Si+Mn+Al>24.5 \quad (1)$$

where a symbol of each element in the expression (1) represents the amount (mass %) of the element in the steel.

(2) The stainless steel substrate for a solar cell having superior insulating properties and a low thermal expansion coefficient described in (1), wherein the stainless steel contains Al: 2.0% or more and Si: 0.3% or more.

(3) The stainless steel substrate for a solar cell having superior insulating properties and a low thermal expansion coefficient described in (1) or (2), wherein the stainless steel further contains one or more elements selected from the group consisting of, by mass %, Sn: 1% or less,
Zr: 0.5% or less,
Mg: 0.005% or less,
Ni: 1% or less,
Cu: 1% or less,
Co: 0.5% or less,
Mo: 2% or less,
V: 0.5% or less,
B: 0.005% or less,
Ca: 0.005% or less,
La: 0.1% or less,
Y: 0.1% or less,
Hf: 0.1% or less,
REM: 0.1% or less,
Nb: 1% or less, and
Ti: 1% or less.

(4) The stainless steel substrate for a solar cell having superior insulating properties and a low thermal expansion coefficient described in (3), wherein the oxide film contains (iii) $MgAl_2O_4$.

(5) The stainless steel substrate for a solar cell having superior insulating properties and a low thermal expansion coefficient described in (4), wherein an amount of (iii) $MgAl_2O_4$ in the oxide film is 5% or more.

(6) A method of producing a stainless steel substrate for a solar cell having superior insulating properties and a low thermal expansion coefficient, the method including:

a film forming step of subjecting the stainless steel having the composition described in any one of (1) to (3) to a heat treatment in an atmosphere containing water vapor in a temperature range of 300° C. to 1000° C. to form an oxide film on a surface of the stainless steel.

(7) The method of producing a stainless steel substrate for a solar cell having superior insulating properties and a low thermal expansion coefficient described in (6), wherein in the film forming step, the heat treatment is performed in an atmosphere containing water vapor having a dew point of 40° C. or higher.

Advantageous Effects of Invention

In the stainless steel substrate for a solar cell according to the present invention, an oxide film containing (i) $Al_2O_3$ in an amount of 50% or more or containing (i) $Al_2O_3$ and (ii) $SiO_2$ in a total amount of 50% or more is formed on a surface of stainless steel having a composition which contains Al: 0.5% or more and/or Si: 0.4% or more and satisfies the expression (1). In addition, an insulating surface capable of maintaining the conversion efficiency of a solar cell at a high level is formed without using a coating or plating method. Accordingly, the stainless steel substrate for a solar cell according to the present invention is preferable as a substrate for a solar cell.

In addition, when the stainless steel of the stainless steel substrate for a solar cell according to the present invention contains Al: 2.0% or more and Si: 0.3% or more, a synergistic effect of promoting the formation of the insulating oxide film can be obtained by Al and Si during the heat treatment, and an increase in thermal expansion coefficient caused by Al addition is effectively suppressed by Si. As a result, the stainless steel substrate for a solar cell includes an oxide film having far superior insulating properties, has a low thermal expansion coefficient, and is preferably used as a substrate for a solar cell.

DESCRIPTION OF EMBODIMENTS

Hereinafter, each requirement according to an embodiment of the present invention will be described in detail. "%" indicating the amount of each element represents "mass %".

In a stainless steel substrate for a solar cell according to the embodiment, the oxide film containing (i) $Al_2O_3$ or the oxide film containing (i) $Al_2O_3$ and (ii) $SiO_2$ and/or (iii) $MgAl_2O_4$ is formed on a surface of a body made of the stainless steel.

The stainless steel contained in the stainless steel substrate for a solar cell according to the embodiment has a composition described below. Therefore, by performing a heat treatment on the stainless steel, the oxide film containing (i) $Al_2O_3$ or the oxide film containing (i) $Al_2O_3$ and (ii) $SiO_2$ and/or (iii) $MgAl_2O_4$ can be formed on the surface of the stainless steel.

(I) The reason for limiting components of the stainless steel will be described below.

The stainless steel included in the stainless steel substrate for a solar cell according to the embodiment is ferritic stainless steel. Cr is a major constituent element of the ferritic stainless steel used in the embodiment. Cr is an essential element which promotes the formation of the oxide film containing (i) $Al_2O_3$ or the insulating oxide film containing (i) $Al_2O_3$ and (ii) $SiO_2$ and/or (iii) $MgAl_2O_4$ and decreases a thermal expansion coefficient when being added in combination with Si and Al. In order to obtain the above-described effects, the lower limit of the Cr content is 9%, preferably 10%, and more preferably 11%. The upper limit of the Cr content is 25%, preferably 20%, and more preferably 18% from the viewpoint of suppressing a decrease in steel toughness and workability caused by addition of Si and Al.

C inhibits the improvement of corrosion resistance and the formation of the insulating oxide film. Therefore, the less the C content there is, the better. The upper limit of the C content is 0.03% and preferably 0.02%. However, since excessive reduction in the amount of C leads to an increase in refining cost, the lower limit of the C content is preferably 0.001% and more preferably 0.002%.

Mn suppresses the oxidation of Fe and promotes the formation of the insulating oxide film during the heat treatment of the stainless steel. In order to obtain the effect of promoting the formation of the insulating oxide film, the Mn content is preferably 0.06% or more, more preferably 0.3% or more, and still more preferably 0.4% or more. On the other hand, since excessive addition of Mn causes a decrease in corrosion resistance and oxidation resistance and an increase in thermal expansion coefficient, the upper limit of the Mn content is 2%, preferably 1.5%, and more preferably 1.0%.

P is an element which inhibits producibility and weldability. Thus, the less the P content there is, the better. In order to suppress a decrease in producibility and weldability, the upper limit of the P content is 0.05% and preferably 0.04%. However, since excessive reduction in the amount of P leads to an increase in refining cost, the lower limit of the P content is preferably 0.005% and more preferably 0.01%.

S inhibits the formation of the insulating oxide film. Thus, the less the S content there is, the better. Therefore, the upper limit of the S content is 0.01% and preferably 0.002%. However, since excessive reduction in the amount of S leads to an increase in refining cost, the lower limit of the S content is preferably 0.0001% and more preferably 0.0002%.

Like C, N inhibits the formation of the insulating oxide film. Thus, the less the N content there is, the better. Therefore, the upper limit of the N content is 0.03% and preferably 0.015%. However, since excessive reduction in the amount of N leads to an increase in refining cost, the lower limit of the N content is preferably 0.001% and more preferably 0.005%.

In order to obtain an effect as a deoxidizing element, the Si content is 0.05% or more and preferably 0.10% or more.

On the other hand, excessive addition of Si causes a decrease in steel toughness and workability. Therefore, the upper limit of the Si content is 4.0%, preferably 3.5%, and more preferably 2.0%.

In order to obtain an effect as a deoxidizing element as with Si, the Al content is 0.005% or more and preferably 0.010% or more.

On the other hand, excessive addition of Al increases the thermal expansion coefficient of the steel and inhibits the durability of the oxide film which is obtained through the heat treatment. Therefore, the upper limit of the Al content is 5.0%, preferably 3.5%, and more preferably 2.5%. When the Al content is more than 5.0%, the thermal expansion coefficient is high, which is not preferable in a substrate for a solar cell.

Si and Al are elements which promote the formation of the insulating oxide film and improve the insulating properties of the oxide film obtained through the heat treatment. Therefore, the stainless steel used in the embodiment contains 0.4% or more of Si and/or 0.5% or more of Al. By using stainless steel which satisfies one of the conditions including Si: 0.4% or more and Al: 0.5% or more, an oxide film having insulating properties which can be used in a substrate for a solar cell can be obtained through the heat treatment.

In addition, by using stainless steel which contains 0.4% or more of Si and 0.5% or more of Al, the formation of $Al_2O_3$ or an Al-containing spinel oxide can be significantly effectively promoted during the heat treatment.

When the Si content is 0.4% or more, an effect of promoting the formation of the insulating oxide film and an effect of decreasing the thermal expansion coefficient of the stainless steel can be obtained. In order to obtain the effect of promoting the formation of the insulating oxide film, the Si content is preferably 0.5% or more and more preferably 1.0% or more.

When the Al content is 0.5% or more, an effect of promoting the formation of the insulating oxide film can be obtained. In order to obtain the effect of promoting the formation of the insulating oxide film, the Al content is preferably 1.0% or more and more preferably 1.5% or more.

In this embodiment, in order to promote the formation of the insulating oxide film by performing the heat treatment while maintaining the desired low thermal expansion coefficient, the amounts of Cr, Mn, Si, and Al are limited as described above, and Cr+10Si+Al+Mn>24.5 (wherein a symbol of each element represents the amount (mass %) of the element in the steel) is satisfied. In ferritic stainless steel containing Cr as a major constituent element, in order to form the insulating oxide film and to decrease the thermal expansion coefficient, Si addition acts effectively and addition of a combination of Si and Al is preferable. Further, Mn addition promotes the formation of the oxide film without an increase in thermal expansion coefficient. From the viewpoint of promoting the formation of the insulating oxide film, the value of "Cr+10Si+Al+Mn" is preferably 27 or more. The upper limit of the value of "Cr+10Si+Al+Mn" is not particularly limited but is preferably 40 and more preferably 35 in consideration of the effects of Si and Al addition on the producibility of the steel.

In addition, the stainless steel used in the embodiment may contain Al: 2.0% or more and Si: 0.3% or more.

When the Al content is 2.0% or more, the insulating properties of the oxide film obtained through the heat treatment are further improved. However, as the Al content increases, the thermal expansion coefficient also increases. Therefore, when the Al content is 2.0% or more, the Si content is preferably 0.3% or more. By adding 0.3% or more of Si, an increase in thermal expansion coefficient caused by addition of 2.0% or more of Al can be suppressed. When the Al content is 2.0% or more, the Si content is more preferably 0.4% or more in order to effectively suppress an increase in thermal expansion coefficient. When stainless steel having a sufficiently low thermal expansion coefficient is used as a substrate for a solar cell, adhesion between a substrate, an Mo electrode, and a CIS light-absorbing layer is high, and superior durability can be obtained.

By adding 2.0% or more of Al and 0.3% or more of Si, a synergistic effect of promoting the formation of the insulating oxide film with Al and Si can be obtained. As a result, in this stainless steel, an oxide film having far superior insulating properties can be obtained through the heat treatment.

In a case where the Al content is less than 2.0%, even when the Si content is less than 0.3%, stainless steel having a sufficiently low thermal expansion coefficient can be obtained. In addition, in a case where the Al content is more than 5.0%, even when an increase in thermal expansion coefficient is suppressed by Si addition, stainless steel having a sufficiently low thermal expansion coefficient cannot be obtained.

In addition, optionally, the stainless steel used in the embodiment further contains one or more elements selected from the group consisting of Sn: 1% or less, Zr: 0.5% or less, Mg: 0.005% or less, Ni: 1% or less, Cu: 1% or less, Co: 0.5% or less, Mo: 2% or less, V: 0.5% or less, B: 0.005% or less, Ca: 0.005% or less, La: 0.1% or less, Y: 0.1% or less, Hf: 0.1% or less, REM: 0.1% or less, Nb: 1% or less, and Ti: 1% or less.

In the ferritic stainless steel used in the embodiment, Sn is optionally added because it suppresses the oxidation of Fe and promotes the formation of the insulating oxide film rich in Si and/or Al. When Sn is added, the Sn content is preferably 0.01% or more, more preferably 0.05% or more, and still more preferably 0.1% or more to exhibit the effects of addition. However, since excessive addition of Sn causes a decrease in the producibility of the steel and an increase in alloy cost, the upper limit of the Sn content is 1%, preferably 0.5%, and more preferably 0.3%.

Zr is optionally added because it promotes the formation of the insulating oxide film due to a synergistic effect with Si and Al. When Zr is added, the Zr content is preferably 0.005% or more, more preferably 0.01% or more, and still more preferably 0.05% or more to exhibit the effects of addition. However, since excessive addition of Zr causes a decrease in the producibility of the steel and an increase in alloy cost, the upper limit of the Zr content is 0.5%, preferably 0.3%, and more preferably 0.15%.

Mg is an element which is effective for hot workability and solidification structure refinement and has an effect of promoting the formation of an Al spinel oxide ($MgAl_2O_4$) when the heat treatment is performed. When Mg is added, the Mg content is preferably 0.0001% or more and more preferably 0.0003% or more to exhibit the effects of addition. However, since excessive addition of Mg inhibits producibility, the upper limit of the Mg content is 0.005% and preferably 0.0015%.

Ni, Cu, Co, Mo, and V are elements which are effective to promote the formation of the insulating oxide film or to improve corrosion resistance due to a synergistic effect with Si and Al, and are optionally added. When Ni, Cu, and Mo are added, the amount of each element is preferably 0.1% or more to exhibit the effect of addition. When V and Co are added, the amount of each element is preferably 0.01% or more to exhibit the effect of addition. However, since excessive addition of the above elements causes an increase in alloy cost and an increase in thermal expansion coefficient, the upper limit of the amount of each of Ni and Cu is 1%, and the upper limit of the amount of each of V and Co is 0.5%. Since Mo is an element which is effective to decrease the thermal expansion coefficient, the upper limit of the Mo content is 2%. The lower limit of the amount of each element is more preferably 0.1% and, the upper limit thereof is 0.5%.

B and Ca are elements which improve hot workability and secondary workability, and addition of B and Ca to ferritic stainless steel is effective. When B and/or Ca is added, the lower limit of the amount of each element is preferably 0.0003% and more preferably 0.0005% to exhibit the effects of addition. However, since excessive addition of B and/or Ca causes a decrease in elongation, the upper limit of the amount of each of B and Ca is 0.005% and preferably 0.0015%.

La, Y, Hf, and REM are elements which are effective to improve hot workability and the cleanliness of the steel and to improve the adhesion of the oxide film obtained through the heat treatment, and are optionally added. When La, Y, Hf, and REM are added, the amount of each element is preferably 0.001% or more to exhibit the effect of addition. However, since excessive addition of the above elements causes an increase in alloy cost and a decrease in producibility, the upper limit of the amount of each of La, Y, Hf, and REM is 0.1% and preferably 0.05%. Here, REM are elements whose atomic numbers range from 57 to 71, for example, Ce, Pr, or Nd.

Nb is optionally added because it promotes the formation of the insulating oxide film through the purification of the steel caused by an effect of a stabilizing element which fixes C and N. When Nb is added, the Nb content is preferably 0.03% or more, more preferably 0.05% or more, and still more preferably 0.1% or more to exhibit the effects of addition. However, since excessive addition of Nb causes an increase in alloy cost and a decrease in producibility caused by an increase in recrystallization temperature, the upper limit of the Nb content is 1%, preferably 0.5%, and more preferably 0.3%.

Ti is optionally added because it purifies the steel due to an effect of a stabilizing element which fixes C and N and promotes the formation of the insulating oxide film. When Ti is added, the Ti content is preferably 0.01% or more, more preferably 0.02% or more, and still more preferably 0.05% or more to exhibit the effects of addition. However, since excessive addition of Ti increases the alloy cost and inhibits the formation of aluminum oxide and $SiO_2$, the upper limit of the Ti content is 1%, preferably 0.35%, and more preferably 0.2%.

(II) The oxide film formed on the surface of the stainless steel will be described below.

In the stainless steel substrate for a solar cell according to the embodiment, the following oxide film is formed on the surface of the stainless steel containing the components described above in (I) in order to provide a suitable insulating surface to the desired substrate for a solar cell according to the embodiment.

The oxide film containing (i) $Al_2O_3$ in an amount of 50% or more or containing (i) $Al_2O_3$ and (ii) $SiO_2$ in a total amount of 50% or more is formed on the surface of the stainless steel substrate for a solar cell according to the embodiment. In the stainless steel substrate for a solar cell according to the embodiment, the above-described oxide film is formed on the surface of the stainless steel. Therefore, the stainless steel substrate for a solar cell has a suitable insulating surface.

In addition, the oxide film may contain (i) $Al_2O_3$ and (iii) $MgAl_2O_4$ (Al-containing spinel oxide), or may further contain (iii) $MgAl_2O_4$ (Al-containing spinel oxide) in addition to (i) $Al_2O_3$ and (ii) $SiO_2$. When the oxide film contains (iii) $MgAl_2O_4$, insulating properties can be improved irrespective of the characteristics of (i) $Al_2O_3$, which is preferable.

When the oxide film does not contain (ii) $SiO_2$ or (iii) $MgAl_2O_4$, the amount of (i) $Al_2O_3$ is preferably 55% or more and more preferably 60% or more in order to obtain far superior insulating properties. The upper limit of the amount of (i) $Al_2O_3$ in the oxide film is not particularly limited. When the oxide film contains (i) $Al_2O_3$ and (iii) $MgAl_2O_4$, the upper limit of the amount of (i) $Al_2O_3$ in the oxide film is preferably 95% and more preferably 80% such that far superior insulating properties can be obtained by addition of (iii) $MgAl_2O_4$.

In addition, when the oxide film contains (ii) $SiO_2$, the amount of (ii) $SiO_2$ in the oxide film is preferably 5% or more and more preferably 15% or more.

When the amount of (ii) $SiO_2$ in the oxide film is 5% or more, (ii) $SiO_2$ is formed, and thus the formation of (i) $Al_2O_3$ is sufficiently promoted. In addition, when the oxide film contains (ii) $SiO_2$, the amount of (ii) $SiO_2$ in the oxide film is preferably 30% or less and more preferably 25% or less in order to secure insulating properties by securing the amount of (i) $Al_2O_3$ in the oxide film.

When the oxide film contains (iii) $MgAl_2O_4$, the amount of (iii) $MgAl_2O_4$ in the oxide film is preferably 5% or more and more preferably 10% or more such that the effect of improving insulating properties can be sufficiently obtained by (iii) $MgAl_2O_4$. The upper limit of the amount of (iii) $MgAl_2O_4$ in the oxide film is not particularly limited. However, in order to obtain superior insulating properties by securing the amount of (i) $Al_2O_3$ in the oxide film, the amount of (iii) $MgAl_2O_4$ is preferably 50% or less and more preferably 30% or less.

In order to maintain the insulating surface, the thickness of the oxide film is preferably 0.01 μm or more. The upper limit of the film thickness is not particularly limited but is preferably 5 μm in consideration of the efficiency of the heat treatment described below. In addition, in the embodiment, the oxide film containing (iii) $MgAl_2O_4$ is formed. As a result, even when the thickness thereof is 1 μm or less, the insulating properties of the surface can be secured.

(III) A method of producing a stainless steel substrate for a solar cell will be described.

In the producing method according to the embodiment, it is preferable to form the oxide film described in (II) on a surface of the stainless steel containing the components described in (I) by performing a heat treatment on the stainless steel in an atmosphere containing water vapor in a temperature range of 300° C. to 1000° C. (film forming step).

The stainless steel on which the heat treatment is performed contains the components described in (I) and can be obtained using a well-known producing method of the related art. The stainless steel subjected to the heat treatment may have any shape that can be used as a stainless steel substrate for a solar cell. The surface texture of the stainless steel subjected to the heat treatment is not particularly limited. For example, the surface of the stainless steel can be polished according to BA, 2B, 2D, No. 4 defined in JIS G4304:2012 and JIS G4305:2012 (corresponding to ISO 16143-1:2004).

In order to form the oxide film described in (II) which is effective for insulating properties, the heat treatment is performed preferably at 300° C. or higher and more preferably 400° C. or higher. When the heat treatment temperature is excessively high, the Al concentration and the Si concentration decreases and the Fe concentration increases in the oxide film, which inhibits the insulating properties and adhesion of the oxide film. Therefore, the upper limit of the heat treatment temperature is preferably 1000° C. and more preferably 900° C.

The heat treatment time is not particularly limited and may be, for example, 1 minutes to 72 hours.

It is preferable that continuous annealing is performed for 10 minutes or less, or a batch type heat treatment is performed for 24 hours to 72 hours as the heat treatment.

It is preferable that the heat treatment for forming the oxide film is performed in an atmosphere containing water vapor. By performing the heat treatment in the atmosphere containing water vapor, the oxidation of Al and Si on the surface of the stainless steel is promoted. Examples of the atmosphere containing water vapor include an atmosphere containing water vapor which is obtained by humidifying dry air (20% oxygen-80% nitrogen). In addition, it is more preferable that the heat treatment for forming the oxide film is performed in an atmosphere containing 5% or more of water vapor in pure oxygen gas. By performing the heat treatment in the above-described atmosphere, the desired oxide film according to the embodiment can be easily formed.

It is preferable that the heat treatment for forming the oxide film is performed in an atmosphere containing water vapor having a dew point of 40° C. or higher. By performing the heat treatment in the above-described atmosphere, (iii) $MgAl_2O_4$ can be effectively formed. The upper limit of the dew point is not particularly limited but is 90° C. in consideration of the workability of the heat treatment.

The amount of each of (i) to (iii) contained in the oxide film can be controlled by changing the composition in the above-described ranges and changing the heat treatment conditions in the above-described ranges of the heat treatment atmosphere and the heat treatment temperature.

EXAMPLES

Hereinafter, examples of the embodiment will be described.

Ferritic stainless steel containing components shown in Table 1 was melted and subjected to hot rolling, annealing, and then cold rolling. As a result, cold-rolled steel sheets having a thickness of 0.5 mm were obtained. Here, as the components of the steel, components which were in the range specified in the embodiment and components which were outside of the range specified in the embodiment were used. The cold-rolled steel sheets were subjected to finish annealing and pickling in a range of 800° C. to 1000° C. in which recrystallization was completed.

A heat treatment was performed on the steel sheets under heat treatment conditions (temperature, holding time, and dew point) shown in Table 2 in an atmosphere containing water vapor obtained by humidifying dry air to a dew point shown in Table 2. The obtained steel sheets were provided for the evaluation of the insulating properties of the surface and the measurement of the thermal expansion coefficient. In addition, proportions (%) of the components of the following (i) to (iii) in the oxide films formed on the surfaces of the obtained steel sheets were calculated. The results are shown in Table 2.

The presence of oxides constituting the oxide films formed on the surfaces were verified by measuring diffraction peaks shown below by X-ray diffraction (CuKα rays were used), and the proportions thereof were obtained.

(i) $Al_2O_3$: (104) plane, $2\theta=35.15°$
(ii) $SiO_2$: (101) plane, $2\theta=26.64°$
(iii) $MgAl_2O_4$: (311) plane, $2\theta=36.85°$
(iv) $Cr_2O_3$: (110) plane, $2\theta=36.16°$/(104) plane, $2\theta=33.6°$ First, the heights (cps) of the diffraction peaks of the (i) to (iii) measured using X-ray diffraction were measured. It was assumed that the oxide films were formed of (i) to (iv) described above, and the abundance ratios of the oxides (i) to (iii) were calculated according to the following method of calculating the abundance ratio of (i) $Al_2O_3$ described below.

The abundance ratios of the oxides, for example, the abundance ratio of (i) $Al_2O_3$ was calculated from (i)/{(i)+(ii)+(iii)+(iv)}×100. In the expression, (i) to (iv) represent the diffraction peak heights (cps) which were measured by the X-ray diffraction from the (104) plane of (i) $Al_2O_3$, the (101) plane (ii) $SiO_2$, the (311) plane of (iii) $MgAl_2O_4$, and the (110) plane of (iv) $Cr_2O_3$.

As the value of (iv) in the expression, the diffraction peak height of the (110) plane which was the main diffraction peak was adopted. Regarding the presence of (iv) $Cr_2O_3$, the presence of the diffraction peak of the (104) plane was verified in order to distinguish the presence of (iv) $Cr_2O_3$ from the diffraction peak of (i) $Al_2O_3$.

In Table 2, "ratio %" represents the sum of the abundance ratios of (i) to (iii).

The insulating properties of the steel sheet surface was evaluated by vapor-depositing an aluminum film (10 mm×10 mm×0.2 μm thickness) on the surface as an electrode and placing a probe of a tester on the electrode to measure the electrical resistance. The measurement was performed on a measurement area 10 times, and the average value thereof was obtained as a measured value. Regarding the desired insulating properties of the embodiment, an electrical resistance value which is desired for a substrate for a CIS solar cell is 1 kΩ or higher. A steel sheet having the desired electrical resistance value was evaluated as "B", and a steel sheet stably exhibiting a higher electrical resistance value (10 kΩ or higher) was evaluated as "A". In addition, a steel sheet having an electrical resistance value of lower than 1 kΩ was evaluated as "C".

A specimen having a size of 1 mm thickness×10 mm width×50 mm length was prepared, and the thermal expansion coefficient thereof was measured using a push-rod type thermal dilatometer. In an Ar atmosphere, the measurement was performed with a spring compression load of 50 g or lower. The thermal expansion coefficient was calculated by measuring the thermal expansion of the specimen when the temperature was increased from 50° C. to 600° C. on the assumption of the film formation on the CIS solar cell. Regarding the desired thermal expansion coefficient of the embodiment, an average linear expansion coefficient measured when the temperature is increased from 50° C. as a base point to 600° C., is preferably $12.5×10^6/°$ C. or lower to maintain the durability of the film formed on the substrate for a CIS solar cell. A steel sheet having the desired thermal expansion coefficient was evaluated as "B", and a steel sheet having a thermal expansion coefficient higher than $12.5×10^{-6}/°$ C. was evaluated as "C".

Table 2 collectively shows the heat treatment conditions and the evaluation results.

In Test Nos. 1 to 10, oxide films containing (i) $Al_2O_3$ in an amount of 50% or more or containing (i) $Al_2O_3$ and (ii) $SiO_2$ in a total amount of 50% or more were formed on surfaces of stainless steel having the composition specified in the embodiment through the heat treatment.

In the steel sheets of Test Nos. 1 to 10, the desired surface insulating properties and the desired thermal expansion coefficient of the embodiment were obtained.

Among these, in Nos. 3, 4, 6, and 9 in which the heat treatment was performed on Steels C, D, F, G, H, and I under heat treatment conditions of a dew point of 40° C. or higher, an oxide film containing (iii) $MgAl_2O_4$ was formed, and the surface insulating properties were evaluated as "A".

In Test Nos. 11 to 13, 15, and 16, steel which did not satisfy either or both of the composition specified in the embodiment and the expression (1) was used.

In the steel sheets of Test Nos. 12, 15, and 16, an oxide film was formed by performing the heat treatment under heat treatment conditions shown in Table 2, but this oxide film did not contain (i) $Al_2O_3$ in an amount of 50% or more or did not contain (i) $Al_2O_3$ and (ii) $SiO_2$ in a total amount of 50% or more. Therefore, the desired surface insulating properties of the embodiment was not obtained.

In addition, in Test Nos. 11 and 13, the insulating properties were superior, but the thermal expansion coefficient was significantly high. Therefore, the steel sheets were not preferable as a substrate for a solar cell.

In Test No. 14, low Cr steel containing components which were outside of the range specified in the embodiment and did not satisfy the expression (1) specified in the embodiment was used. In Test No. 14, the desired thermal expansion coefficient of the embodiment was not obtained. In addition, an oxide film was formed by performing the heat treatment under heat treatment conditions shown in Table 2, but this oxide film did not contain (i) $Al_2O_3$ in an amount of 50% or more and did not contain (i) $Al_2O_3$ and (ii) $SiO_2$ in a total amount of 50% or more. Therefore, the desired surface insulating properties of the embodiment were not obtained.

The following was found from the above results: in order to impart surface insulating properties to a ferritic stainless steel sheet, it is necessary that an oxide film containing (i) $Al_2O_3$ in an amount of 50% or more or containing (i) $Al_2O_3$ and (ii) $SiO_2$ in a total amount of 50% or more as specified in the embodiment is formed on the surface of the stainless steel sheet. Here, in order to improve surface insulating properties, it is effective to form an oxide film further containing (iii) $MgAl_2O_4$ in addition to (i) $Al_2O_3$ or in addition to (i) $Al_2O_3$ and (ii) $SiO_2$ on the surface of the stainless steel sheet. Further, in order to simultaneously realize the desired thermal expansion coefficient and the desired surface insulating properties of the embodiment, the components specified in the embodiment and the component adjustment for satisfying the expression (1) are effective.

TABLE 1

| Steel | C | Si | Mn | P | S | Cr | Nb | Ti | Al | N | Others | Index |
|---|---|---|---|---|---|---|---|---|---|---|---|---|
| A | 0.028 | 0.45 | 0.80 | 0.032 | 0.008 | 24.0 | 0 | 0 | 1.20 | 0.025 |  | 30.5 |
| B | 0.005 | 2.70 | 0.30 | 0.025 | 0.001 | 18.2 | 0.45 | 0 | 0.30 | 0.010 | Sn: 0.05, V: 0.2, Co: 0.1 | 45.8 |
| C | 0.006 | 0.48 | 0.21 | 0.030 | 0.001 | 17.9 | 0 | 0.19 | 2.10 | 0.012 | La: 0.01, REM: 0.01, Mg: 0.001 | 25.0 |
| D | 0.025 | 1.55 | 0.10 | 0.035 | 0.002 | 10.9 | 0 | 0.15 | 1.20 | 0.010 | Sn: 0.2, Mg: 0.0008 | 27.7 |
| E | 0.010 | 3.80 | 1.70 | 0.030 | 0.001 | 11.5 | 0.25 | 0.20 | 0.40 | 0.010 |  | 51.6 |
| F | 0.005 | 2.55 | 0.30 | 0.030 | 0.002 | 12.5 | 0.15 | 0.15 | 0.60 | 0.012 | Mg: 0.0005 | 38.9 |
| G | 0.015 | 0.55 | 0.50 | 0.030 | 0.001 | 14.7 | 0.30 | 0.01 | 4.60 | 0.015 | Mg: 0.005, B: 0.005, Ca: 0.003 | 25.3 |
| H | 0.008 | 0.95 | 0.30 | 0.028 | 0.001 | 13.2 | 0.42 | 0.03 | 1.60 | 0.015 | Ni: 0.15, Cu: 0.15, Mg: 0.001 | 24.6 |
| I | 0.005 | 0.30 | 0.65 | 0.030 | 0.001 | 18.2 | 0.10 | 0.18 | 3.00 | 0.013 | Zr: 0.01, Mg: 0.005, Hf: 0.02 | 24.9 |
| J | 0.012 | 1.50 | 0.06 | 0.035 | 0.001 | 12.7 | 0 | 0.15 | 1.10 | 0.015 | Zr: 0.1, Mo: 0.3, Y: 0.01 | 28.9 |
| K | 0.004 | 0.10 | 0.14 | 0.022 | 0.001 | 18.2 | 0 | 0.11 | 2.99 | 0.010 |  | 22.3 |
| L | 0.005 | 0.32 | 0.15 | 0.020 | 0.001 | 18.0 | 0 | 0.13 | 1.20 | 0.010 |  | 22.6 |
| M | 0.005 | 0.36 | 0.20 | 0.020 | 0.001 | 18.2 | 0 | 0.11 | 5.78 | 0.012 |  | 27.8 |
| N | 0.010 | 1.50 | 0.50 | 0.030 | 0.001 | 8.8 | 0.15 | 0.20 | 2.10 | 0.010 |  | 26.4 |
| O | 0.010 | 0.30 | 0.50 | 0.030 | 0.001 | 18.0 | 0.15 | 0.20 | 0.45 | 0.010 |  | 22.0 |
| P | 0.010 | 0.30 | 0.35 | 0.030 | 0.001 | 22.0 | 0 | 0.25 | 0.40 | 0.012 |  | 25.8 |

(Note)
Index: Cr + 10Si + Mn + Al

TABLE 2

| No. | Steel | Heat Treatment Conditions Temperature, °C. | Time, min | Dew Point, °C. | Surface Oxide Film $Al_2O_3$ (%) | $SiO_2$ (%) | $MgAl_2O_4$ (%) | Ratio % | Surface Insulating Properties | Thermal Expansion Coefficient | Remark |
|---|---|---|---|---|---|---|---|---|---|---|---|
| 1 | A | 980 | 10 | 35 | 55 | 0 | 0 | 55 | B | B | Example |
| 2 | B | 900 | 1 | 45 | 25 | 25 | 0 | 50 | B | B | Example |
| 3 | C | 850 | 10 | 50 | 80 | 0 | 10 | 90 | A | B | Example |
| 4 | D | 380 | 55 | 55 | 60 | 5 | 5 | 70 | A | B | Example |
| 5 | E | 450 | 10 | 45 | 20 | 35 | 0 | 55 | B | B | Example |
| 6 | F | 500 | 10 | 55 | 35 | 15 | 15 | 65 | A | B | Example |
| 7 | G | 600 | 50 | 40 | 55 | 0 | 35 | 90 | A | B | Example |
| 8 | H | 550 | 30 | 45 | 60 | 5 | 10 | 75 | A | B | Example |
| 9 | I | 920 | 55 | 70 | 75 | 0 | 20 | 95 | A | B | Example |
| 10 | J | 500 | 30 | 35 | 60 | 10 | 0 | 70 | B | B | Example |
| 11 | K | 930 | 50 | 50 | 80 | 0 | 0 | 80 | B | C | Comparative Example |
| 12 | L | 600 | 50 | 45 | 45 | 0 | 0 | 45 | C | B | Comparative Example |
| 13 | M | 980 | 10 | 45 | 90 | 0 | 0 | 90 | B | C | Comparative Example |
| 14 | N | 380 | 55 | 55 | 20 | 5 | 0 | 25 | C | C | Comparative Example |
| 15 | O | 900 | 1 | 45 | 20 | 0 | 0 | 20 | C | B | Comparative Example |
| 16 | P | 930 | 1 | 45 | 25 | 0 | 0 | 25 | C | B | Comparative Example |

(Note 1)
Surface insulating properties: 1 kΩ or higher which is desired in the present invention was evaluated as "B", and a value of less than 1 kΩ was evaluated as "C".
(Note 2)
Thermal Expansion Coefficient: 600° C., $12.5 \times 10^{-6}/°C.$ or lower which is desired in the present invention was evaluated as "B", and a value of higher than $12.5 \times 10^{-6}/°C.$ was evaluated as "C".

INDUSTRIAL APPLICABILITY

According to the present invention, it is possible to obtain a stainless steel substrate for a solar cell which have a low thermal expansion coefficient and is preferable as a substrate for a solar cell having, and in which an insulating surface capable of maintaining the conversion efficiency of a solar cell at a high level can be formed without using a coating or plating method. In particular, the present invention is suitable for a substrate for a CIS solar cell in which an electrode and a light-absorbing layer are formed on an insulating substrate.

The invention claimed is:
1. A stainless steel substrate for a solar cell having superior insulating properties and a low thermal expansion coefficient, the stainless steel substrate comprising:
   stainless steel which contains, by mass %,
   Cr: 9% to 25%,
   C: 0.03% or less,
   Mn: 2% or less,
   P: 0.05% or less,
   S: 0.01% or less,
   N: 0.03% or less,
   Al: 0.005% to 5.0%,
   Si: 0.05% to 4.0%, and a remainder including Fe and unavoidable impurities, satisfies one or both of Al content is 0.5% or more and Si content is 0.4% or more, and satisfies the following expression (1); and an oxide film formed on a surface of the stainless steel, the oxide film containing (i) $Al_2O_3$ in an amount of 50% or more or containing (i) $Al_2O_3$ and (ii) $SiO_2$ in a total amount of 50% or more, $$Cr+10Si+Mn+Al>24.5 \quad (1)$$

where a symbol of each element in the expression (1) represents the amount (mass %) of the element in the steel, wherein the oxide film contains (iii) $Mg\ Al_2O_4$.

2. The stainless steel substrate for a solar cell having superior insulating properties and a low thermal expansion coefficient according to claim 1,
wherein the stainless steel contains Al: 2.0 to 5.0% and Si: 0.3 to 4.0%.

3. The stainless steel substrate for a solar cell having superior insulating properties and a low thermal expansion coefficient according to claim 1,
wherein the stainless steel further contains one element or two or more elements selected from the group consisting of, by mass %,
Sn: 1% or less,
Zr: 0.5% or less,
Mg: 0.0001 to 0.005%,
Ni: 1% or less,
Cu: 1% or less,
Co: 0.5% or less,
Mo: 2% or less,
V: 0.5% or less,
B: 0.005% or less,
Ca: 0.005% or less,
La: 0.1% or less,
Y: 0.1% or less,
Hf: 0.1% or less,
REM: 0.1% or less,
Nb: 1% or less, and
Ti: 1% or less.

4. The stainless steel substrate for a solar cell having superior insulating properties and a low thermal expansion coefficient according to claim 3,
wherein an amount of (iii) $MgAl_2O_4$ in the oxide film is 5% or more.

5. A method of producing a stainless steel substrate for a solar cell having superior insulating properties and a low thermal expansion coefficient, the method comprising:
a film forming step of subjecting the stainless steel having the composition according to claim 1 to a heat treatment in an atmosphere containing water vapor in a temperature range of 300° C. to 1000° C. to form an oxide film on a surface of the stainless steel.

6. The method of producing a stainless steel substrate for a solar cell having superior insulating properties and a low thermal expansion coefficient according to claim 5,
wherein in the film forming step, the heat treatment is performed in an atmosphere containing water vapor having a dew point of 40° C. or higher.

7. The stainless steel substrate for a solar cell having superior insulating properties and a low thermal expansion coefficient according to claim 2,
wherein the stainless steel further contains one element or two or more elements selected from the group consisting of, by mass %,
Sn: 1% or less,
Zr: 0.5% or less,
Mg: 0.005% or less,
Ni: 1% or less,
Cu: 1% or less,
Co: 0.5% or less,
Mo: 2% or less,
V: 0.5% or less,
B: 0.005% or less,
Ca: 0.005% or less,
La: 0.1% or less,
Y: 0.1% or less,
Hf: 0.1% or less,
REM: 0.1% or less,
Nb: 1% or less, and
Ti: 1% or less.

8. The stainless steel substrate for a solar cell having superior insulating properties and a low thermal expansion coefficient according to claim 7,
wherein the oxide film contains (iii) $MgAl_2O_4$.

9. The stainless steel substrate for a solar cell having superior insulating properties and a low thermal expansion coefficient according to claim 8,
wherein an amount of (iii) $MgAl_2O_4$ in the oxide film is 5% or more.

10. A method of producing a stainless steel substrate for a solar cell having superior insulating properties and a low thermal expansion coefficient, the method comprising:
a film forming step of subjecting the stainless steel having the composition according to claim 2 to a heat treatment in an atmosphere containing water vapor in a temperature range of 300° C. to 1000° C. to form an oxide film on a surface of the stainless steel.

11. A method of producing a stainless steel substrate for a solar cell having superior insulating properties and a low thermal expansion coefficient, the method comprising:
a film forming step of subjecting the stainless steel having the composition according to claim 3 to a heat treatment in an atmosphere containing water vapor in a temperature range of 300° C. to 1000° C. to form an oxide film on a surface of the stainless steel.

* * * * *